(12) United States Patent
Rinn

(10) Patent No.: US 6,825,939 B2
(45) Date of Patent: Nov. 30, 2004

(54) METHOD AND MEASURING ARRANGEMENT FOR DETECTING AN OBJECT

(75) Inventor: Klaus Rinn, Heuchelheim (DE)

(73) Assignee: Leica Microsystems Semiconductor GmbH, Wetzlar (DE)

( * ) Notice: Subject to any disclaimer, the term of this patent is extended or adjusted under 35 U.S.C. 154(b) by 0 days.

(21) Appl. No.: 10/186,664

(22) Filed: Jul. 2, 2002

(65) Prior Publication Data

US 2003/0011762 A1 Jan. 16, 2003

(30) Foreign Application Priority Data

Jul. 4, 2001 (DE) .......................................... 101 31 897

(51) Int. Cl.[7] .............................................. G01B 11/04
(52) U.S. Cl. ...................................... 356/636; 356/625
(58) Field of Search ................ 356/237.1, 237.2–237.5, 356/399–401, 485, 486, 489, 490, 614–616, 620, 622, 625, 634–636, 637–640; 250/205, 559.19–559.28; 382/144–151

(56) References Cited

U.S. PATENT DOCUMENTS

| | | | | |
|---|---|---|---|---|
| 4,772,128 A | * | 9/1988 | Vinarub et al. .............. 356/635 |
| 4,850,712 A | * | 7/1989 | Abshire ....................... 356/602 |
| 5,757,507 A | * | 5/1998 | Ausschnitt et al. .......... 356/401 |
| 5,866,915 A | * | 2/1999 | Pryor et al. ............... 250/559.2 |
| 5,883,714 A | * | 3/1999 | Jann et al. ................... 356/484 |
| 6,160,623 A | * | 12/2000 | Uchiyama et al. .......... 356/401 |
| 6,323,953 B1 | * | 11/2001 | Blaesing-Bangert et al. ..... 356/614 |

FOREIGN PATENT DOCUMENTS

DE    198 19 492 A1 * 11/1999  .......... G01B/11/24

* cited by examiner

Primary Examiner—Richard A. Rosenberger
Assistant Examiner—Vincent P. Barth
(74) Attorney, Agent, or Firm—Crowell & Moring LLP

(57) ABSTRACT

The present invention relates to a method and a measurement apparatus for detection of a specimen (1), a specimen (1) being illuminated with a light source (2) and imaged with the aid of an imaging optical system (3) onto a detector (4) preferably embodied as a CCD camera, and the specimen (1) being detected repeatedly with the detector (4). With the method and the measurement apparatus according to the present invention, fluctuations in the statistical analysis of detected signals or data can be minimized, the detected signals or data being subject to detection-related error sources. The method and the measurement apparatus according to the present invention are characterized in that the detection time of the detector (4) for the individual detections and/or the intensity of the light serving for specimen illumination are varied.

36 Claims, 2 Drawing Sheets

METHOD AND MEASURING ARRANGEMENT FOR DETECTING AN OBJECT

CROSS REFERENCE TO RELATED APPLICATIONS

This application claims priority of the German patent application 101 31 897.9 which is incorporated by reference herein.

FIELD OF THE INVENTION

The present invention relates to a method and a measurement apparatus for detection of a specimen, a specimen being illuminated with a light source and imaged with the aid of an imaging optical system onto a detector preferably embodied as a CCD camera, and the specimen being detected repeatedly with the detector.

BACKGROUND OF THE INVENTION

Methods for the detection of specimens are known from practical use. In industrial applications, for example in the metrology of line widths or positions on substrates of the semiconductor industry, coordinate measuring instruments such as those described, for example, in German Patent Application DE 198 19 492.7-52 are used. This measuring instrument serves for highly accurate measurement of the coordinates of features on substrates, e.g. masks, wafers, flat screens, and evaporatively deposited features, but in particular for transparent substrates. The coordinates are determined relative to a reference point, to an accuracy of a few nanometers. In this context, for example, a specimen is illuminated with light of a mercury vapor lamp and is imaged by means of the imaging optical system onto a CCD camera. The CCD camera usually acquires several images of the same specimen using the same exposure time. The images thus obtained are conveyed to a statistical analysis operation. The statistical analysis operation comprises, for example, an averaging of the detected image data. The overall result thus obtained has better repeatability as compared to analysis of an individual image.

Methods for the detection of a specimen in which the specimen is detected repeatedly with a detector can be problematic if, for example, changes in illumination intensity occur during the period of the individual detections. In the case of the coordinate measuring instrument, the specimens detected are principally ones that have defined specimen features, the specimen features in turn having linear edges. One of the tasks of a coordinate measuring instrument is to determine the location of the edges of the specimens as accurately as possible relative to a reference point. After the detection of several images of the same specimen with a CCD camera, it has been found that in the event of even slight fluctuations in the exposure time of the CCD camera, the edge location after a statistical analysis of the detected image data has changed. Attempts have accordingly been made to select the target range of the automatic exposure system as narrowly as possible, so that the location of the edges in the detected image data does not change. This procedure is not possible for all regions of the same specimen, however, so that a certain residual error in edge location has hitherto been unavoidable. In addition, the change in the detection of the edge location can also be based on residual errors that are not directly associated with the exposure time of the CCD camera. These residual errors can be of systematic or random origin. Ultimately, what is desirable is to minimize all the residual errors and the changes in data analysis associated with them.

SUMMARY OF THE INVENTION

It is therefore the object of the present invention to describe and develop a method for detection of a specimen in which the fluctuations in the statistical analysis of detected signals or data are minimized, the detected signals or data being subject to detection-related error sources.

A further object of the present invention is to describe and develop a measurement apparatus for detection of a specimen in which the fluctuations in the statistical analysis of detected signals or data can be minimized, the detected signals or data being subject to detection-related error sources.

A method for detection of a specimen according to the present invention comprises the steps:

illuminating a specimen with a light source, imaging said specimen with the aid of an imaging optical system onto a detector, detecting said specimen repeatedly with the detector, and thereby varying the detection time of the detector for the individual detections or the intensity of the light serving for specimen illumination.

Another method for detection of a specimen according to the present invention comprises the steps:

illuminating a specimen with a light source, imaging said specimen with the aid of an imaging optical system onto a detector, detecting said specimen repeatedly with the detector, and thereby varying the detection time of the detector for the individual detections and the intensity of the light serving for specimen illumination.

What has been recognized according to the present invention is firstly that external influences such as, for example, slight fluctuations in the light intensity of the light source can be prevented, if at all, only with a great deal of effort. Even optimization of the automatic detection time system, with the goal of setting the optimum detector detection time for each specimen detection, cannot yield error-free results in every case. If additional random or systematic specimen detection errors are also to be minimized, then according to the present invention once again no analysis is made of the cause underlying the individual errors, in order then to minimize each of them with a corresponding error-reducing action.

Instead, according to the present invention, the detection time of the detector is varied for each individual detection. Varying the detection time firstly increases the noise bandwidth of the measurement results, since the influences of the different detection times are incorporated into the result. The statistical analysis of the measured data, however, averages over all the changeable error components. In this respect, therefore, only the average error due to detection time influences in the elapsed detection time interval is incorporated into the measurement result. At a constant detection time, however, the entire or constant error component is incorporated into the detection, which becomes apparent in the context of a further detection or a further detection series with modified detection conditions.

According to the present invention, therefore, no provision is made for further development of the automatic detection time system with the intention of achieving the same detection result in changed environmental conditions; instead, the detection time of the detector is deliberately varied so that subsequent statistical analysis of the detected measured data (largely independently of the changed environment conditions) yields a result that is very close to the actual expected result, minimizing the error due to detection time variation.

Additionally or alternatively, according to the present invention provision is made for the intensity of the light serving for specimen illumination to be varied for each individual detection. This could be accomplished, for example, with a rotating neutral density filter disk arranged in the illumination beam path.

The variation in detection time and/or the variation in the intensity of the light serving for specimen illumination must, however, be accomplished in such a way that the detected signals lie in the range of permissible detector modulation, i.e. they must not exceed the dynamic range of the detector. In a corresponding method step, provision is accordingly made for determining the limits of the permissible detector modulation in the context of a calibration operation. A variation in detection time is then advisable only within those limits. For some applications, however, provision could also be made for deliberate overmodulation during a detection, for example in order to be able to depict specimen regions with different intensities in the low dynamic range of the detector, while other specimen regions yield intensities that are detected in overmodulated fashion with that setting for the detection time.

The variation in detection time and/or in the intensity of the light serving for specimen illumination could be accomplished systematically or randomly. A systematic variation in detection time could be accomplished, for example, by increasing or decreasing the detection time by a constant value from one detection to another. In addition, the variation in detection time could be achieved randomly, for example with pseudorandom numbers or with a random generator in conjunction with the detector controller. A variation in detection time could also be accomplished by way of the detector controller, in particular if the latter is connected to a unit that controls the overall system. In the context of the coordinate measuring instrument cited above, for example, the variation in detection time—i.e. in the exposure time of the CCD camera—is implemented by way of a corresponding electronic control system, the "camera timing control."

A neutral density disk arranged in the beam path, which has regions of differing neutral density value that are preferably arranged circumferentially, could serve to vary the intensity of the light serving for specimen illumination. The neutral density disk could be arranged in the illumination beam path in such a way that as a result of its rotation, the differing regions act on the illumination beam path and correspondingly vary the intensity of the light serving for specimen illumination. A variation of the emitted light power level of the light source is also conceivable.

In a further method step, the detected specimen data are conveyed to a statistical analysis operation. What is provided here in the simplest case is an averaging of the individual specimen detections, in particular if residual errors of random origin are to be minimized. A different statistical weighting operation is also conceivable, for example if systematic residual errors need to be minimized. The statistical analysis also encompasses method steps that, for example, determine characteristic properties of the detected specimen. Provision is thus made for determining the shape and the location of the specimen. The change in the characteristic properties of the detected specimen is determined as a function of the detection time variation during the respective detection of the specimen, so that statistical parameters, for example the variance and standard deviation, of the measured characteristic specimen properties can be determined therefrom. The influence of the variation in detection time on the detected specimen data is accordingly extracted.

In a very particularly preferred method step, a specimen property that is to be detected is determined on the basis of a fit curve. The specimen property could involve, for example, characteristic specimen properties such as the specimen location or the shape of the specimen. The statistical analysis of the detected specimen data and the influence of the variation in detection time on the detected specimen data are employed to determine the fit curve. Ultimately, therefore, the result of the detected specimen property can always be determined according to the same protocol. For example, the function value of the fit curve in the middle of the detection time interval is defined as the result of a statistical analysis.

A measurement apparatus for detection of a specimen according to the present invention, preferably in the form of a coordinate measuring instrument, comprises:

a light source that illuminates said specimen, an imaging optical system that images said specimen onto a detector, means for detecting said specimen repeatedly with said detector, means for varying the detection time of said detector for the individual detections or the intensity of the light serving for specimen illumination.

Another measurement apparatus for detection of a specimen according to the present invention, preferably in the form of a coordinate measuring instrument, comprises:

a light source that illuminates said specimen, an imaging optical system that images said specimen onto a detector, means for detecting said specimen repeatedly with said detector, means for varying the detection time of said detector for the individual detections and the intensity of the light serving for specimen illumination.

The measurement apparatus according to the present invention is preferably configured in such a way that it is suitable for carrying out a method as defined in one of claims 1 through 20. In particular, the detector here is embodied as a CCD camera. To eliminate repetition, the reader is referred in this context to that portion of the Specification corresponding to the method for detection of a specimen.

There are various ways of advantageously embodying and developing the teaching of the present invention. The reader is referred, for that purpose, on the one hand to the dependent claims to claims 1, 11 and 21 and 23, and on the other hand to the explanation below of a preferred exemplary embodiment of the invention with reference to the drawings. In conjunction with the explanation of the preferred exemplary embodiment of the invention with reference to the drawings, an explanation is also given of generally preferred embodiments and developments of the teaching.

DETAILED DESCRIPTION OF THE INVENTION

Figure 1:
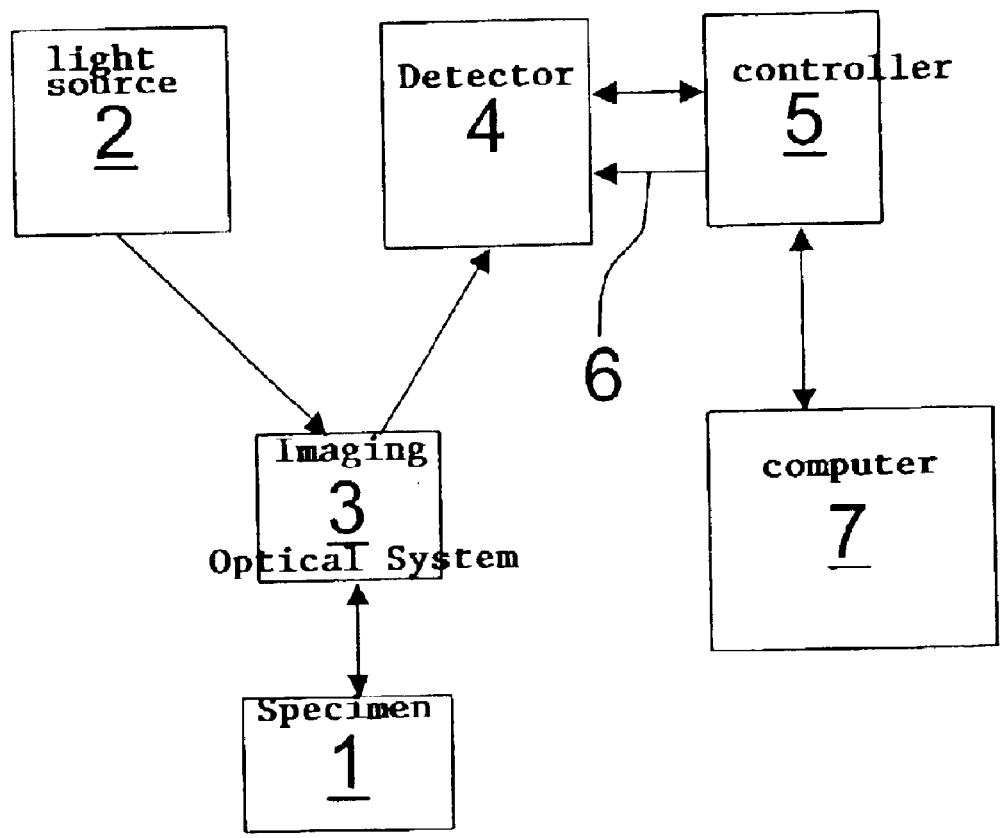
FIG. 1 schematically depicts a measurement apparatus according to the present invention for detection of a specimen.

FIG. 1 schematically shows a measurement apparatus, embodied as a coordinate measuring instrument, for detection of a specimen 1. Specimen 1 is illuminated with a light source 2. An imaging optical system 3 images at least a portion of specimen 1 onto a detector 4. Detector 4 is embodied as a CCD camera. Specimen 1 is detected or imaged several times with detector 4.

Figure 2:
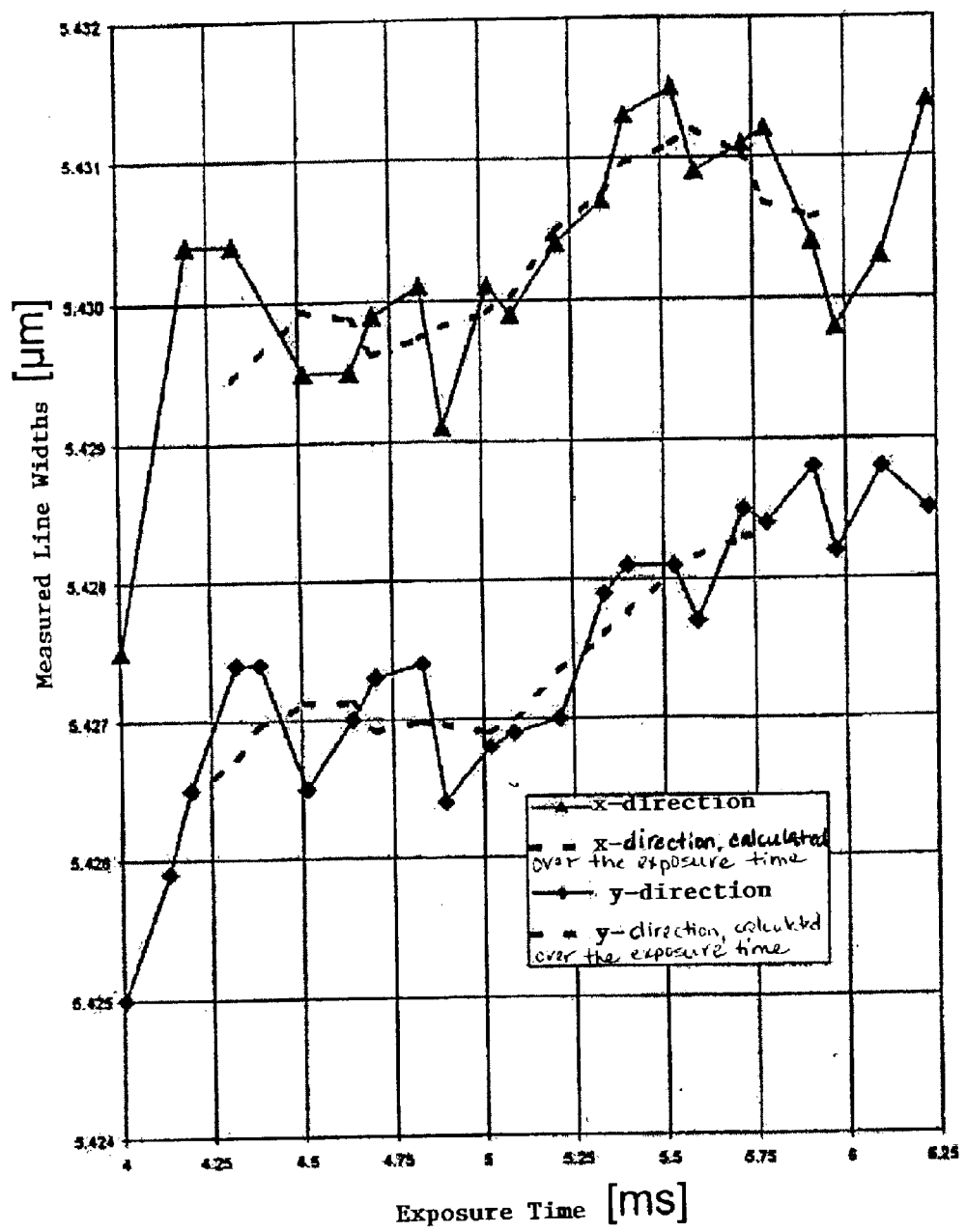
FIG. 2 is a diagram in which measured line widths of a feature are plotted as a function of differing detection times.

Specimen 1 is an exposure mask, for wafer exposure in the semiconductor industry, that is to be measured; what is to be determined is the width and location, relative to a reference point, of individual conductor features provided thereon. The diagram of FIG. 2 shows the measured line widths in μm as a function of the exposure time of the CCD camera; the readings marked with triangles indicate the line width in the X direction. The readings marked with diamonds, on the other hand, indicate the measured line widths in the Y direction of the CCD camera. The differing exposure times are indicated in ms; it is evident from the diagram that disproportionately large deviations in the measured line widths occur in particular at the exposure times of 4.5 ms, 4.9 ms, 5.6 ms, and 5.97 ms. To illustrate these deviations, the readings in the X and the Y direction are respectively connected with a solid line. If a specimen is detected using exposure times in these critical regions, even small variations in exposure time can have a disproportionate influence on line width.

According to the present invention, the exposure time of the CCD camera is therefore varied for the individual detections. For that purpose, detector controller 5 (i.e. the camera timing control) uses a random generator to generate differing exposure times that are transmitted in digital form to detector 4 via control line 6. In this context, the exposure time of detector 4 is dimensioned such that it lies in the range of the permissible detector modulation, so that overexposure of detector 4 is prevented.

The image data of specimen 1 acquired by detector 4 are conveyed to a statistical analysis operation that is implemented in control and analysis computer 7 of the measurement apparatus. The lines depicted with dashes in FIG. 2 are a result of the statistical analysis of the measured line widths at differing detection times; these are moving averages over five exposure times. It is thus evident from this curve that while the line widths do change as a function of exposure time, large deviations as compared to the original readings nevertheless do not occur.

Preferably, therefore, the influence of the variation in exposure time on the line width is determined from the detected data and calculated out. The result of this is a curve for line width as a function of the particular exposure time that was set. This curve is used to extrapolate the line width in the context of a detection of the specimen at a constant exposure time. For example, the line width as a function of the maximum detected brightness of the line profile could be approximated by means of a fit line. That fit line could be read off at a constant brightness in the middle of the modulation or illumination time interval.

In conclusion, be it noted very particularly that the exemplary embodiment discussed above serves merely to describe the teaching claimed, but does not limit it to the exemplary embodiment.

| PARTS LIST |
| --- |
| 1 Specimen |
| 2 Light source |
| 3 Imaging optical system |
| 4 Detector |
| 5 Detector controller |
| 6 Control line |
| 7 Control and analysis computer |

What is claimed is:

1. A method for detection of a specimen (1), comprising the steps:
    illuminating a specimen (1) with a light source (2),
    imaging said specimen (1) with the aid of an imaging optical system (3) onto a detector (4),
    detecting said specimen (1) repeatedly with the detector (4), and
    varying the detection time of the detector (4) for the individual detections or the intensity of the light serving for specimen illumination.

2. The method as defined in claim 1, wherein the variation in detection time or the variation in the intensity of the light serving for specimen illumination is accomplished in such a way that the detected signals lie in the range of permissible detector modulation.

3. The method as defined in claim 1, wherein the variation in detection time or in the intensity of the light serving for specimen illumination is accomplished systematically or randomly.

4. The method as defined in claim 2, wherein the variation in detection time or in the intensity of the light serving for specimen illumination is accomplished systematically or randomly.

5. The method as defined in claim 1, wherein the detection time is varied by way of the detector controller.

6. A method for detection of a specimen (1), comprising the steps:
    illuminating a specimen (1) with a light source (2),
    imaging said specimen (1) with the aid of an imaging optical system (3) onto a detector (4),
    detecting said specimen (1) repeatedly with the detector (4), and
    varying the detection time of the detector (4) for the individual detections or the intensity of the light serving for specimen illumination, and
    wherein the intensity of the light serving for specimen illumination is varied by using a rotating neutral density disk arranged in the beam path.

7. The method as defined in claim 1, wherein detected specimen data are conveyed to a statistical analysis operation.

8. The method as defined in claim 7, wherein the influence of the variation in detection time on the detected specimen data is extracted.

9. A method for detection of a specimen (1), comprising the steps:
    illuminating a specimen (1) with a light source (2),
    imaging said specimen (1) with the aid of an imaging optical system (3) onto a detector (4),
    detecting said specimen (1) repeatedly with the detector (4), and
    varying the detection time of the detector (4) for the individual detections or the intensity of the light serving for specimen illumination, wherein detected specimen data are conveyed to a statistical analysis operation, and wherein a specimen geometric property that is to be detected is determined on the basis of a fit curve or fit function.

10. A method for detection of a specimen (1), comprising the steps:

illuminating a specimen (1) with a light source (2), imaging said specimen (1) with the aid of an imaging optical system (3) onto a detector (4), detecting said specimen (1) repeatedly with the detector (4), and varying the detection time of the detector (4) for the individual detections or the intensity of the light serving for specimen illumination, and wherein a specimen geometric property that is to be detected is determined on the basis of a fit curve or fit function.

11. A method for detection of a specimen (1), comprising the steps:

illuminating a specimen (1) with a light source (2), imaging said specimen (1) with the aid of an imaging optical system (3) onto a detector (4), detecting said specimen (1) repeatedly with the detector (4), and varying the detection time of the detector (4) for the individual detections and the intensity of the light serving for specimen illumination.

12. The method as defined in claim 11, wherein the variation in detection time or the variation in the intensity of the light serving for specimen illumination is accomplished in such a way that the detected signals lie in the range of permissible detector modulation.

13. The method as defined in claim 11, wherein the variation in detection time or in the intensity of the light serving for specimen illumination is accomplished systematically or randomly.

14. The method as defined in claim 12, wherein the variation in detection time or in the intensity of the light serving for specimen illumination is accomplished systematically or randomly.

15. The method as defined in claim 11, wherein the detection time is varied by way of the detector controller.

16. A method for detection of a specimen (1), comprising the steps:

illuminating a specimen (1) with a light source (2), imaging said specimen (1) with the aid of an imaging optical system (3) onto a detector (4), detecting said specimen (1) repeatedly with the detector (4), and varying the detection time of the detector (4) for the individual detections and the intensity of the light serving for specimen illumination, and wherein the intensity of the light serving for specimen illumination is varied by using a rotating neutral density disk arranged in the beam path.

17. The method as defined in claim 11, wherein detected specimen data are conveyed to a statistical analysis operation.

18. The method as defined in claim 17, wherein the influence of the variation in detection time on the detected specimen data is extracted.

19. A method for detection of a specimen (1), comprising the steps:

illuminating a specimen (1) with a light source (2), imaging said specimen (1) with the aid of an imaging optical system (3) onto a detector (4), detecting said specimen (1) repeatedly with the detector (4), and varying the detection time of the detector (4) for the individual detections and the intensity of the light serving for specimen illumination, wherein detected specimen data are conveyed to a statistical analysis operation, and wherein a specimen geometric property that is to be detected is determined on the basis of a fit curve or fit function.

20. A method for detection of a specimen (1), comprising the steps:

illuminating a specimen (1) with a light source (2), imaging said specimen (1) with the aid of an imaging optical system (3) onto a detector (4), detecting said specimen (1) repeatedly with the detector (4), and varying the detection time of the detector (4) for the individual detections and the intensity of the light serving for specimen illumination, and wherein a specimen geometric property that is to be detected is determined on the basis of a fit curve or fit function.

21. A measurement apparatus for detection of a specimen (1) in a coordinate measuring instrument, comprising:

a light source (2) that illuminates said specimen (1), an imaging optical system (3) that images said specimen (1) onto a detector (4), means for detecting said specimen (1) repeatedly with said detector (4), means for varying the detection time of said detector (4) for the individual detections or the intensity of the light serving for specimen illumination.

22. The measurement apparatus as defined in claim 21, wherein the detector is a CCD camera.

23. A measurement apparatus for detection of a specimen (1) in a coordinate measuring instrument, comprising:

a light source (2) that illuminates said specimen (1), an imaging optical system (3) that images said specimen (1) onto a detector (4), means for detecting said specimen (1) repeatedly with said detector (4), means for varying the detection time of said detector (4) for the individual detections and the intensity of the light serving for specimen illumination.

24. The measurement apparatus as defined in claim 23, wherein the detector is a CCD camera.

25. The method according to claim 1, wherein the detector is a CCD camera.

26. The method according to claim 9, wherein the specimen geometric property is a specimen location.

27. The method according to claim 9, wherein the fit curve or fit function is a fit line.

28. The method according to claim 10, wherein the specimen geometric property is a specimen location.

29. The method according to claim 28, wherein the fit curve or fit function is a fit line.

30. The method according to claim 11, wherein the detector is a CCD camera.

31. The method according to claim 19, wherein the specimen geometric property is a specimen location.

32. The method according to claim 19, wherein the fit curve or fit function is a fit line.

33. The method according to claim 20, wherein the specimen geometric property is a specimen location.

34. The method according to claim 33, wherein the fit curve or fit function is a fit line.

35. The method as defined in claim 1, wherein the act of varying the detection time of the detector or the intensity of the light includes varying the detection time of the detector or the intensity of the light from one detection of the specimen with the detector to another detection of the specimen with the detector.

36. The measurement apparatus as defined in claim 21, wherein means for varying the detection time of said detector or the intensity of the light includes means for varying the detection time of the detector or the intensity of the light from one detection of the specimen with the detector to another detection of the specimen with the detector.

* * * * *